United States Patent
Mun

(10) Patent No.: US 12,374,410 B2
(45) Date of Patent: Jul. 29, 2025

(54) SEMICONDUCTOR DEVICE AND OPERATING METHOD OF SEMICONDUCTOR DEVICE

(71) Applicant: SK hynix Inc., Gyeonggi-do (KR)

(72) Inventor: Yeong Jo Mun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 171 days.

(21) Appl. No.: 18/331,937

(22) Filed: Jun. 9, 2023

(65) Prior Publication Data

US 2024/0331779 A1  Oct. 3, 2024

(30) Foreign Application Priority Data

Mar. 29, 2023 (KR) .................... 10-2023-0041174

(51) Int. Cl.
  *G11C 16/34* (2006.01)
  *G11C 16/04* (2006.01)
  *G11C 16/10* (2006.01)

(52) U.S. Cl.
  CPC ...... *G11C 16/3404* (2013.01); *G11C 16/0483* (2013.01); *G11C 16/10* (2013.01); *G11C 16/3459* (2013.01)

(58) Field of Classification Search
  CPC . G11C 16/3404; G11C 16/0483; G11C 16/10; G11C 16/3459; G11C 2211/5621; G11C 11/5628; G11C 16/24; G11C 16/08; G11C 16/12; G11C 16/34
  USPC .................................................. 365/185.24
  See application file for complete search history.

(56) References Cited

U.S. PATENT DOCUMENTS

| | | | |
|---|---|---|---|
| 11,961,570 B2* | 4/2024 | Sarin | G11C 16/16 |
| 12,068,033 B2* | 8/2024 | Kim | G11C 16/3431 |
| 2007/0036001 A1* | 2/2007 | Kanda | G11C 16/12 |
| | | | 365/185.18 |
| 2007/0183208 A1* | 8/2007 | Tanaka | G11C 16/3418 |
| | | | 365/185.24 |
| 2009/0273978 A1* | 11/2009 | Fukuda | G11C 16/3404 |
| | | | 365/185.24 |
| 2010/0238733 A1* | 9/2010 | Fukuda | G11C 11/5621 |
| | | | 365/185.17 |
| 2012/0275223 A1* | 11/2012 | Baek | G11C 16/0483 |
| | | | 365/185.11 |
| 2015/0270009 A1* | 9/2015 | Lee | G11C 16/3459 |
| | | | 365/185.22 |
| 2021/0280262 A1* | 9/2021 | Jeong | G11C 16/10 |

FOREIGN PATENT DOCUMENTS

KR  10-2015-0109120 A  10/2015
KR  10-1666942 B1  10/2016

* cited by examiner

*Primary Examiner* — Fernando Hidalgo
(74) *Attorney, Agent, or Firm* — IP & T GROUP LLP

(57) ABSTRACT

Disclosed is a semiconductor device including a plurality of strings connected between a plurality of bit lines and a source line, a plurality of page buffers connected to the plurality of bit lines, respectively, and configured to adjust a voltage level of each of the plurality of bit lines, and a control circuit configured to control the plurality of page buffers to fix a voltage level of a bit line connected to a string including a memory cell on which a program operation has been completely performed and to change a voltage level of a bit line connected to a string including a memory cell on which the program operation has not been completely performed, during a de-trap operation.

20 Claims, 9 Drawing Sheets

DISTRIBUTION IMPROVEMENT

SEMICONDUCTOR DEVICE AND OPERATING METHOD OF SEMICONDUCTOR DEVICE

CROSS-REFERENCE TO RELATED APPLICATION(S)

This application claims priority under 35 U.S.C. § 119 to Korean Patent Application No. 10-2023-0041174, filed on Mar. 29, 2023, the disclosure of which is incorporated herein by reference in its entirety.

BACKGROUND

1. Technical Field

Various embodiments of the present disclosure relate to integrated circuit technology, and more particularly, to a semiconductor device and an operating method of the semiconductor device.

2. Related Art

With the recent trend of electronic appliances toward miniaturization, low power consumption, high performance, and diversification, semiconductor devices capable of storing information in various electronic appliances such as a computer and a portable communication device have been demanded. Semiconductor devices may be classified into volatile memory devices and non-volatile memory devices. Volatile memory devices have a high data processing speed, but have a disadvantage in that power needs to be continuously supplied to retain stored data, whereas non-volatile memory devices do not need to be continuously supplied with power to retain stored data, but have a low data processing speed.

Even though memory cells are included in a non-volatile memory device, reliability of the memory cells decreases because a threshold voltage distribution of the memory cells deteriorates as the number of program operations and/or erase operations increases.

SUMMARY

In accordance with an embodiment of the present disclosure, a semiconductor device may include a plurality of strings connected between a plurality of bit lines and a source line, a plurality of page buffers connected to the plurality of bit lines, respectively, and configured to adjust a voltage level of each of the plurality of bit lines, and a control circuit configured to control during a de-trap operation, the plurality of page buffers to fix a voltage level of a bit line connected to a first string including a memory cell on which a program operation has been completely performed and to change a voltage level of a bit line connected to a second string including a memory cell on which the program operation has not been completely performed In accordance with an embodiment of the present disclosure, a semiconductor device may include memory cells subject to a program operation, a plurality of page buffers connected to the memory cells through a plurality of bit lines, respectively, and a control circuit configured to control the plurality of page buffers, to perform a de-trap operation on first memory cells on which the program operation has not been completely performed among the memory cells, and not to perform the de-trap operation on second memory cells on which the program operation has been completely performed among the memory cells.

In accordance with an embodiment of the present disclosure, an operating method of a semiconductor device may include performing a program verification operation, performing a de-trap operation on based on a result of the program verification operation, and providing a program pulse.

In accordance with an embodiment of the present disclosure, an operating method of a semiconductor device may include forming channels in memory cells connected to a plurality of bit lines and a word line selected among a plurality of word lines, wherein a program operation has not been completely performed on the memory cells, driving the selected word line and the plurality of bit lines at a ground voltage and disconnecting a bit line connected to a memory cell subject to a de-trap operation among the memory cells.

In accordance with an embodiment of the present disclosure, a semiconductor device may include a plurality of strings each including memory cells, and a control circuit configured to perform, on selected memory cells, a program operation in which program pulse application operations and program verification operations are alternately repeatedly performed, wherein the control circuit further performs, during a period between a program pulse application operation and a program verification operation, a de-trap operation on memory cells on which the program pulse application operations are performed a predetermined number of times and the program operation is not passed.

DETAILED DESCRIPTION

Various embodiments of the present disclosure are directed to a semiconductor device capable of improving a threshold voltage distribution of a memory cell by using a de-trap operation, and an operating method of the semiconductor device.

According to embodiments of the present disclosure, it is possible to improve reliability of a memory by improving a threshold voltage distribution of the memory cell.

Hereinafter, various embodiments according to the technical spirit of the present disclosure are described below with reference to the accompanying drawings.

Figure 1:
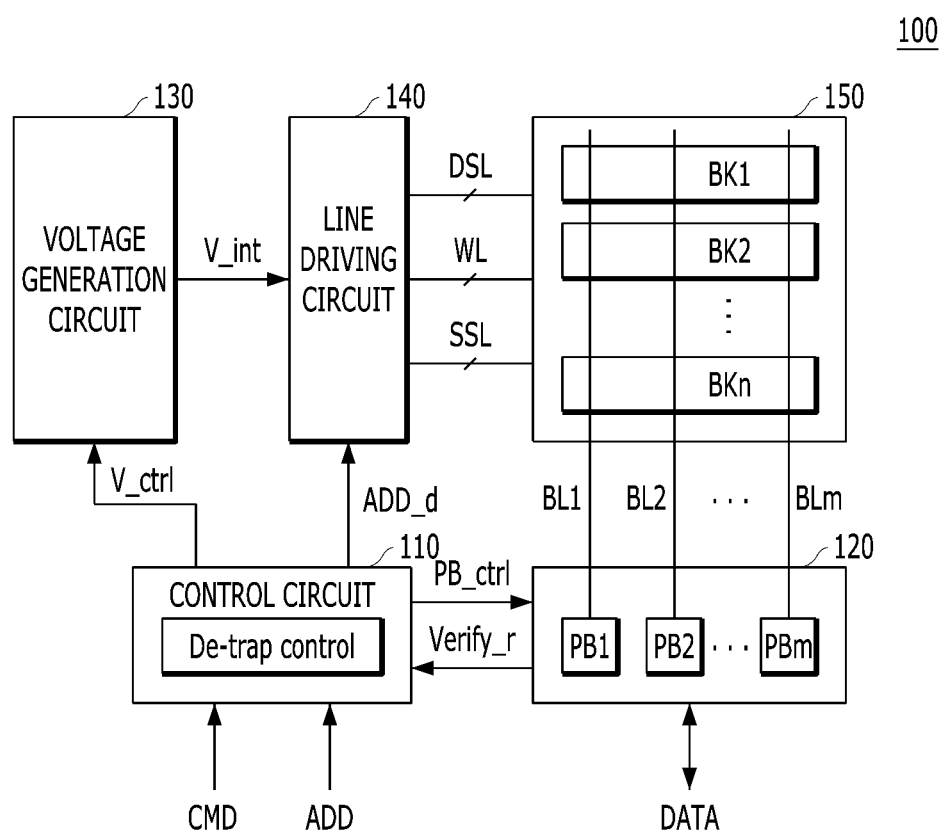
FIG. 1 is a diagram illustrating a structure of a semiconductor device in accordance with an embodiment of the present disclosure.

FIG. 1 is a diagram illustrating a structure of a semiconductor device 100 in accordance with an embodiment of the present disclosure.

Referring to FIG. 1, the semiconductor device 100 may include a control circuit 110, a page buffer group 120, a voltage generation circuit 130, a line driving circuit 140, and a memory cell array 150.

The control circuit 110 may control the page buffer group 120, the voltage generation circuit 130 and the line driving circuit 140 to program data DATA into the memory cell array 150 or to erase the programmed data.

For example, the control circuit 110 may program the data DATA into a partial region of the memory cell array 150 or erase the programmed data, on the basis of a command signal CMD and an address signal ADD. In this case, the command signal CMD may be a program command signal or an erase command signal, and the address signal ADD may include an address value corresponding to the partial region.

The page buffer group 120 may include a plurality of page buffers PB1, PB2, . . . , and PBm. The plurality of page buffers PB1, PB2, . . . , and PBm may be connected to a plurality of bit lines BL1, BL2, . . . , and BLm, respectively. Each of the plurality of page buffers PB1, PB2, . . . , and PBm may sense a threshold voltage of a memory cell through a bit line, compare the threshold voltage of the memory cell with a target threshold voltage according to data during a program operation, perform a verification operation of checking whether the memory cell is completely programmed, and provide the control circuit 110 with a verification operation result Verify_r. Each of the plurality of page buffers PB1, PB2, . . . , and PBm may perform the verification operation on the basis of a page buffer control signal PB_ctrl provided from the control circuit 110. In addition, the plurality of page buffers PB1, PB2, . . . , and PBm may drive the bit lines BL1, BL2, . . . , and BLm, respectively, with a specific voltage level on the basis of the page buffer control signal PB_ctrl.

The voltage generation circuit 130 may generate internal voltages V_int each having a voltage level according to a voltage control signal V_ctrl. In this case, the voltage generation circuit 130 may receive the voltage control signal V_ctrl from the control circuit 110.

The line driving circuit 140 may drive driving lines DSL, WL and SSL with the voltage levels of the internal voltages V_int on the basis of a driving address signal ADD_d. In this case, the driving lines DSL, WL and SSL may include a drain selection line DSL, a word line WL, and a source selection line SSL. The line driving circuit 140 may receive the internal voltages V_int from the voltage generation circuit 130, and receive the driving address signal ADD_d from the control circuit 110.

The memory cell array 150 may include a plurality of memory blocks BK1, BK2, . . . , and BKm. The plurality of memory blocks BK1, BK2, . . . , and BKm may be connected to the plurality of bit lines BL1, BL2, . . . , and BLm and the driving lines DSL, WL, and SSL. Configurations of the plurality of memory blocks BK1, BK2, . . . , and BKm are described below with reference to FIG. 2.

The semiconductor device 100, which has the above-described configuration, may perform the program operation. In addition, the semiconductor device 100 may perform the verification operation with respect to the program operation. Furthermore, the semiconductor device 100 may perform a de-trap operation between the program operation and the verification operation in order to improve a threshold voltage distribution of a programmed memory cell. The de-trap operation may also be performed under the control of the control circuit 110.

The de-trap operation of the semiconductor device 100 may include an operation of forming a channel having a predetermined voltage level in a memory cell, allowing a string including the memory cell in which the channel is formed to float, and driving a word line connected to the memory cell in which the channel is formed with a voltage level lower than the voltage level of the channel.

The semiconductor device 100 may perform the de-trap operation during the program operation, and prevent the de-trap operation from being performed on the memory cell on which the program operation has been completely performed, on the basis of the verification operation result Verify_r. Consequently, the semiconductor device 100 may perform the de-trap operation on a memory cell on which the program operation has not been completely performed, and stop the de-trap operation on the memory cell on which the program operation has been completely performed.

Figure 2:
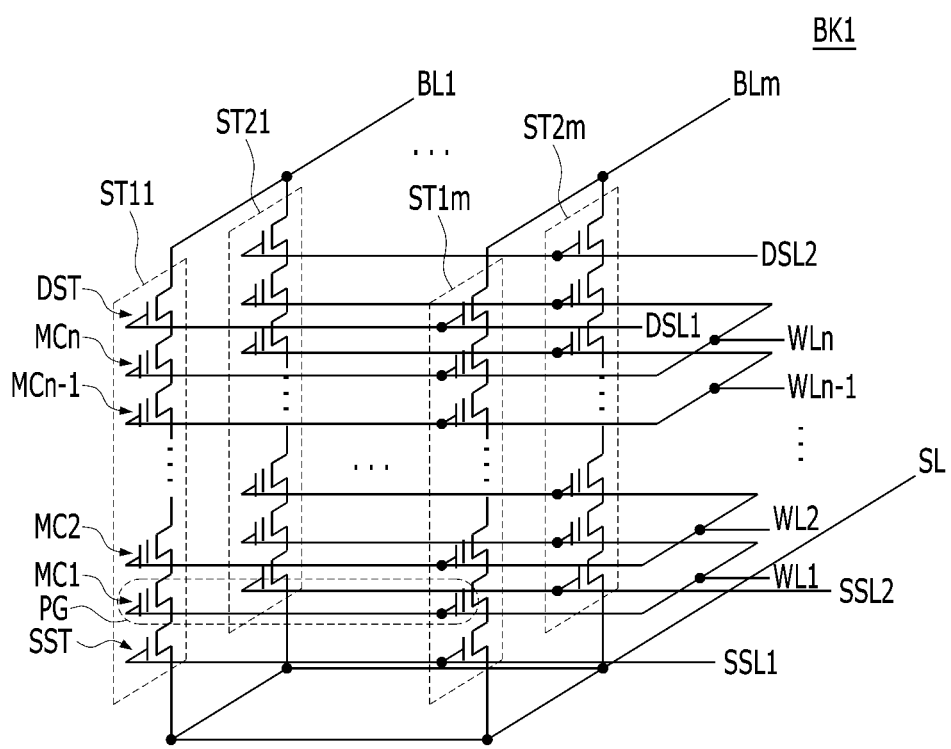
FIG. 2 is a diagram illustrating a structure of a memory block included in a semiconductor device in accordance with an embodiment of the present disclosure.

FIG. 2 is a diagram illustrating a structure of a memory block included in the semiconductor device 100 in accordance with an embodiment of the present disclosure. As illustrated in FIG. 1, the semiconductor device 100 may include the plurality of memory blocks BK1, BK2, . . . , and BKm. Since each of the plurality of memory blocks BK1, BK2, . . . , and BKm has the same internal configuration except for the names of inputted signals and connected lines, only the configuration of one memory block BK1 is described.

Referring to FIG. 2, the memory block BK1 may include a plurality of strings ST11, ST21, ST1$m$, and ST2$m$.

Each of the plurality of strings ST11, ST21, ST1$m$, and ST2$m$ may be connected between the plurality of bit lines BL1 and BLm and a source line SL. In this case, the plurality of bit lines BL1 and BLm may include a first bit line BL1 and a second bit line BLm, and the plurality of strings ST11, ST21, ST1$m$, and ST2$m$ may include a first string ST11, a second string ST21, a third string ST1$m$, and a fourth string ST2$m$.

For example, the first string ST11 may be connected between the first bit line BL1 and the source line SL, and be connected to a first drain selection line DSL1 and a first source selection line SSL1. The second string ST21 may be connected between the first bit line BL1 and the source line SL, and be connected to a second drain selection line DSL2 and a second source selection line SSL2. The third string ST1$m$ may be connected between the second bit line BLm and the source line SL, and be connected to the first drain selection line DSL1 and the first source selection line SSL1. The fourth string ST2$m$ may be connected between the second bit line BLm and the source line SL, and be connected to the second drain selection line DSL2 and the second source selection line SSL2. In this case, the first to fourth strings ST11, ST21, ST1$m$, and ST2$m$ may be connected to a plurality of word lines WL1 to WLn in common.

As described above, the plurality of strings ST11, ST21, ST1$m$, and ST2$m$ may be distinguished by connected bit lines, drain selection lines, and source selection lines.

The plurality of strings ST11, ST21, ST1$m$, and ST2$m$ may have the same configuration except for the names of the connected lines. For example, each of the plurality of strings ST11, ST21, ST1$m$, and ST2$m$ may include a drain selection transistor DST, a plurality of cell transistors MC1 to MCn connected to one another in series, and a source selection transistor SST.

Detailed descriptions of the configurations of the plurality of strings ST11, ST21, ST1m, and ST2m is illustrated by a description of the configuration of the first string ST11.

The first string ST11 may include the drain selection transistor DST, the plurality of cell transistors MC1 to MCn connected to one another in series, and the source selection transistor SST.

The drain selection transistor DST may have a gate connected to the first drain selection line DSL1, and a drain and a source connected to the first bit line BL1 and the cell transistor MCn, respectively. In this case, the cell transistor MCn may be a last cell transistor MCn among the plurality of cell transistors MC1 to MCn connected to one another in series.

Gates of the plurality of cell transistors MC1 to MCn connected to one another in series may be connected to the plurality of word lines WL1 to WLn, respectively.

The source selection transistor SST may have a gate connected to the first source selection line SSL1, and a drain and a source connected to the source line SL and the cell transistor MC1, respectively. In this case, the cell transistor MC1 may be a first cell transistor MC1 among the plurality of cell transistors MC1 to MCn connected to one another in series.

The memory block BK1 of the semiconductor device 100, which has the above-described configuration, may be connected to the same word line among memory cells included in strings selected by a drain selection line, and a unit of memory cells on which the program operation is simultaneously performed may be defined as a page PG. The de-trap operation of the semiconductor device 100 may be an operation performed in a unit of pages PG.

Figure 3:
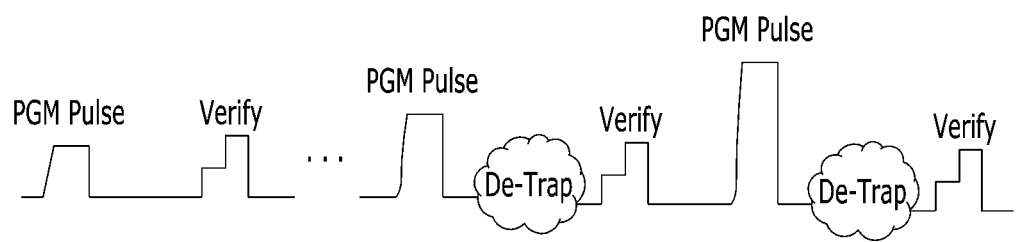
FIGS. 3 and 4 are diagrams for describing timing and effects of a de-trap operation of a semiconductor device in accordance with an embodiment of the present disclosure.
Figure 4:
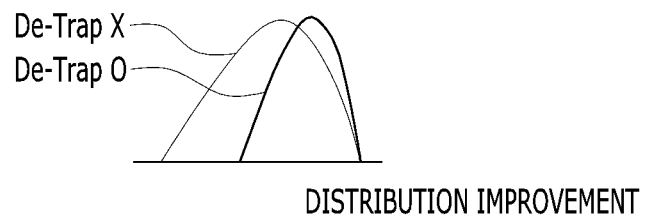

FIGS. 3 and 4 are diagrams for describing timing and effects of the de-trap operation of a semiconductor device in accordance with an embodiment of the present disclosure.

Referring to FIG. 3, the de-trap operation De-Trap may be an operation performed during the program operation. The program operation may include an operation of repeatedly performing an operation in which a program pulse 'PGM Pulse' is provided until a threshold voltage of a memory cell exceeds a target level, and the threshold voltage of the memory cell is sensed 'Verify'. A voltage level of the program pulse PGM Pulse may increase as the number of times that the program pulse PGM Pulse is provided increases. During the program operation, it may be determined that the programming of a memory cell whose threshold voltage exceeds the target level has been completely performed. During the program operation, it may be determined that the programming of a memory cell whose threshold voltage does not exceed the target level has not been completely performed, that is, the memory cell is being programmed.

During the program operation, the operation 'Verify' of sensing the threshold voltage of the memory cell may include an operation of comparing the sensed threshold voltage with the target level, which is referred to as a program verification operation.

The de-trap operation 'De-Trap' may be an operation performed after the program verification operation 'Verify' is performed a predetermined number of times. In addition, the de-trap operation 'De-Trap' may be an operation performed after the program pulse 'PGM Pulse' is provided a predetermined number of times. For example, the de-trap operation 'De-Trap' may be an operation performed in a period between the operation in which the program pulse 'PGM Pulse' is provided and the program verification operation 'Verify' after the program pulse 'PGM Pulse' is provided the predetermined number of times or the program verification operation 'Verify' is performed the predetermined number of times.

In addition, the de-trap operation 'De-Trap' of the semiconductor device in accordance with the present embodiment may be controlled to be performed only on a memory cell on which the program operation has not been completely performed.

Referring to FIG. 4, a threshold voltage distribution 'De-Trap O' of a memory cell on which the de-trap operation 'De-Trap' is performed may be improved to a greater level relative to a threshold voltage distribution 'De-Trap X' of a memory cell on which the de-trap operation 'De-Trap' is not performed. For example, when a string including a memory cell in which a channel is formed floats, and a word line connected to the memory cell in which the channel is formed is driven at a voltage level lower than the voltage level of the channel, an operation in which some of charges trapped in a tunnel oxide of the memory cell move to the channel may be referred to as "de-trap". The semiconductor device in accordance with the present embodiment may improve the threshold voltage distribution of the memory cell by using the de-trap operation.

Figure 5:
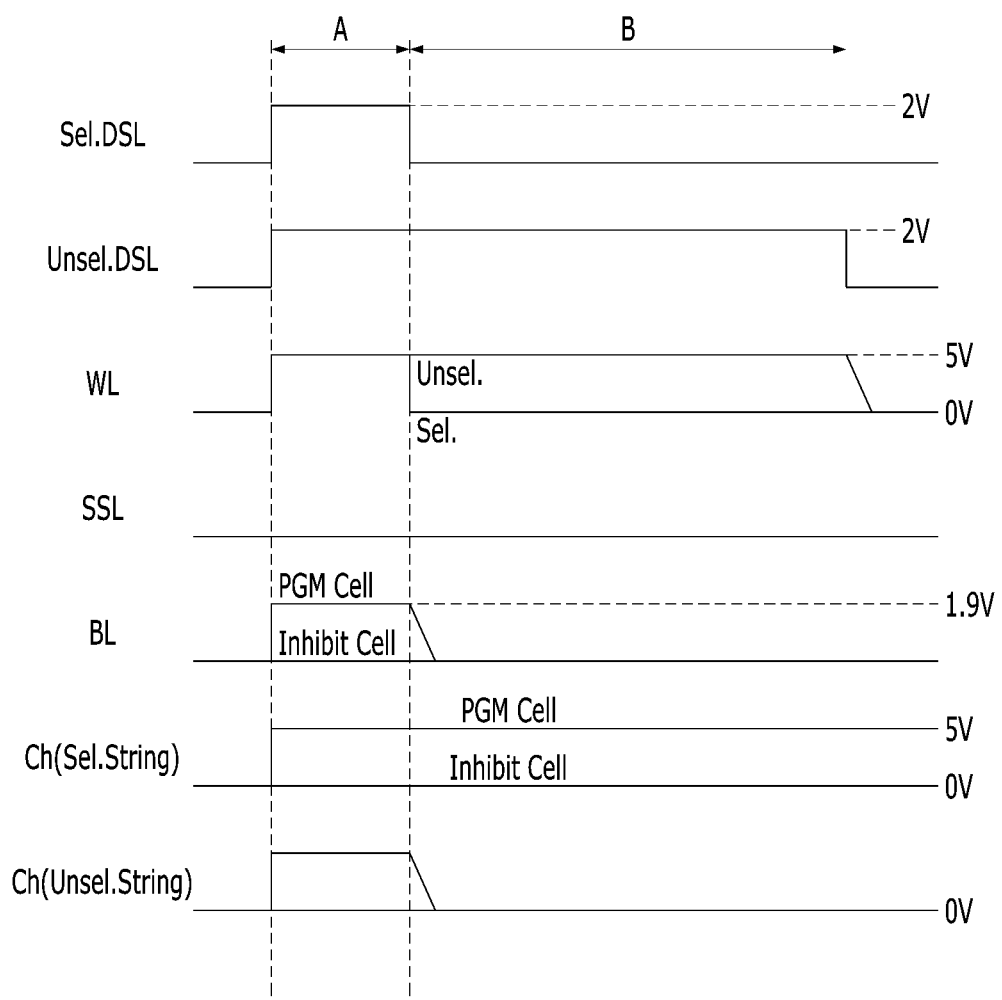
FIG. 5 is a timing diagram for describing a de-trap operation of a semiconductor device in accordance with an embodiment of the present disclosure.

FIG. 5 is a timing diagram for describing the de-trap operation of a semiconductor device in accordance with an embodiment of the present disclosure.

Referring to FIG. 5, the de-trap operation of the semiconductor device may include a channel formation period A and a de-trap period B.

In the channel formation period A, a bit line BL connected to a target memory cell (i.e., a memory cell subject to the de-trap operation) is driven at a first voltage level, for example, 1.9 V, and a word line WL is driven at a second voltage level, for example, a pass voltage level of 5 V. In this case, memory cells in which channels CH each having a predetermined voltage level of 5 V are formed may be included in strings connected between the bit line BL driven at the first voltage level of 1.9 V and the word line WL driven at the second voltage level of 5 V. In addition, the memory cell subject to the de-trap operation may refer to a memory cell on which the program operation is being performed. Furthermore, the semiconductor device may simultaneously program memory cells coupled to the same word line, and a unit of memory cells programmed simultaneously may be referred to as a page.

The de-trap period B may include a period in which a string Sel.String including the memory cell subject to the de-trap operation is disconnected from the bit line BL, in order to de-trap only the memory cell subject to the de-trap operation. For example, a drain selection line Sel.DSL connected to the string Sel.String including the memory cell subject to the de-trap operation may transition to a ground voltage (i.e., 0 V). In this case, a drain selection transistor DST may be turned off, and the string Sel.String may be disconnected from the bit line BL.

Moreover, a string Unsel.String including a memory cell not subject to the de-trap operation may remain connected to the bit line BL. That is, an unselected drain selection line Unsel.DSL may maintain a voltage level of 2 V so that a drain selection transistor included in the string Unsel.String including the memory cell not subject to the de-trap operation remains turned on.

The de-trap period B may include a period in which the bit line BL transitions to the ground voltage, and only the word line WL connected to the memory cell subject to the de-trap operation transitions to the ground voltage. In this case, only the memory cell of the string Sel.String, which is disconnected from the bit line BL and is connected to the word line WL driven at the ground voltage, may maintain the channel CH having the predetermined voltage level, and be de-trapped. The channel CH formed in the memory cell of the unselected string Unsel.String connected to the bit line BL driven at the ground voltage may be removed, and the memory cell of the unselected string Unsel.String might not be de-trapped.

The semiconductor device may drive a voltage level of the bit line BL connected to a memory cell Inhibit Cell on which the program operation has been completely performed and a voltage level of the bit line BL connected to a memory cell PGM Cell on which the program operation has not been complete performed, that is, the program operation is being performed, at different voltage levels in the channel formation period A.

In the channel formation period A, the bit line BL connected to the memory cell Inhibit Cell on which the program operation has been completely performed may be fixed to the ground voltage, thereby preventing the channel CH from being formed in the memory cell Inhibit Cell on which the program operation has been completely performed. In the channel formation period A, the bit line BL connected to the memory cell PGM Cell on which the program operation is being performed may be driven at the first voltage level of 1.9 V, thereby forming the channel CH in the memory cell PGM Cell on which the program operation is being performed.

Figure 6:
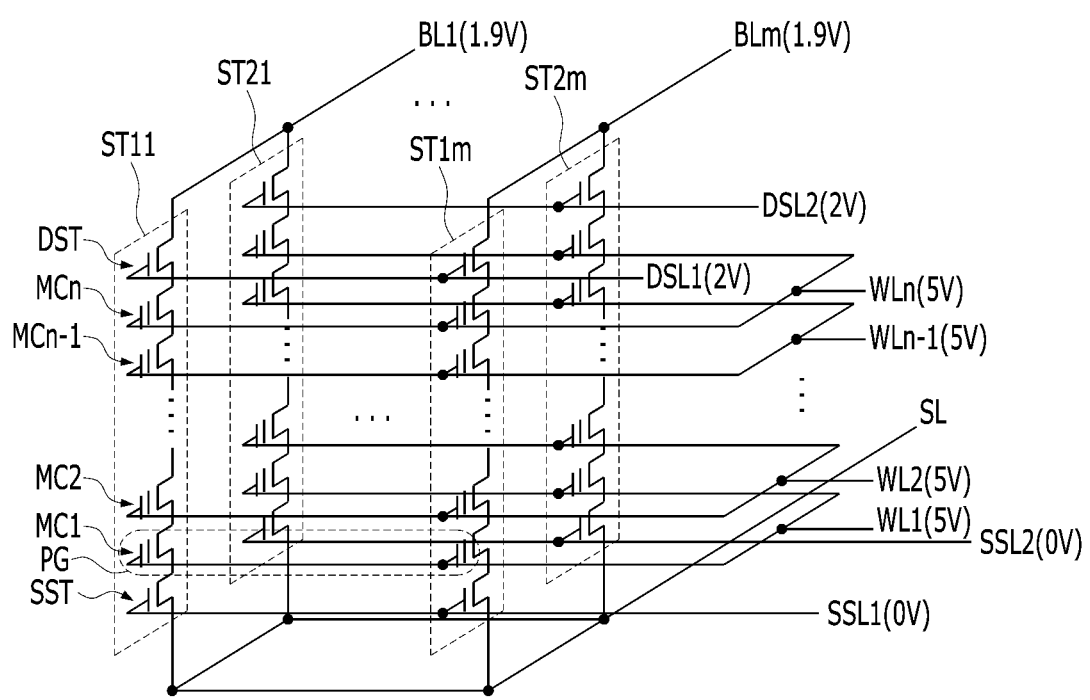
FIGS. 6 to 8 are diagrams for describing a de-trap operation performed in a unit of memory blocks of a semiconductor device in accordance with an embodiment of the present disclosure.
Figure 7:
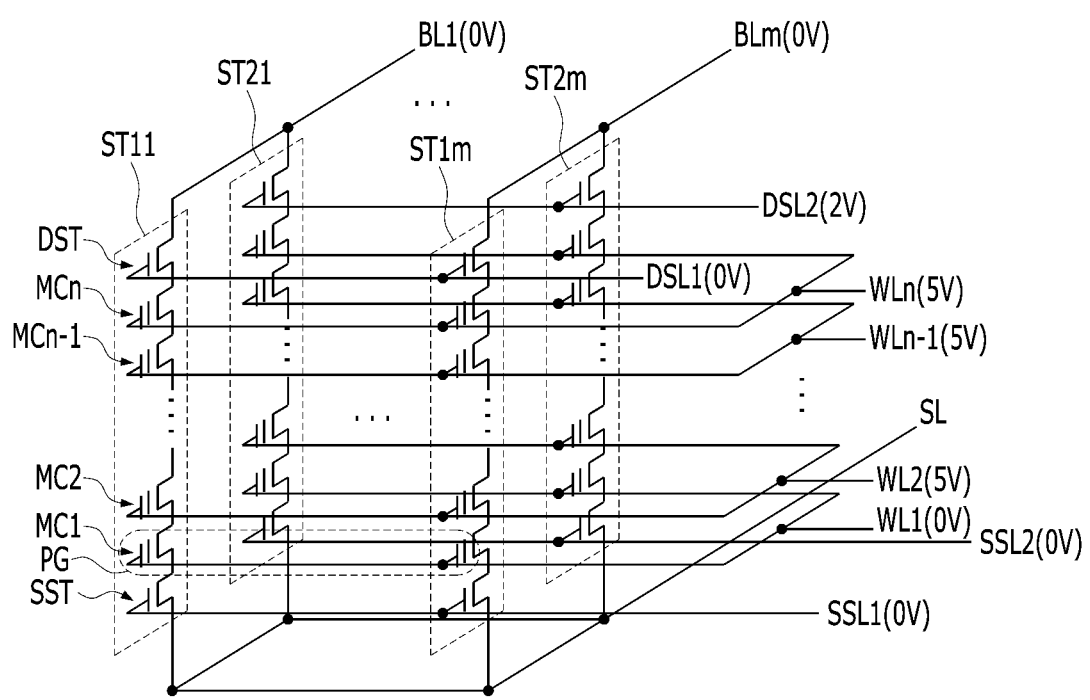
Figure 8:
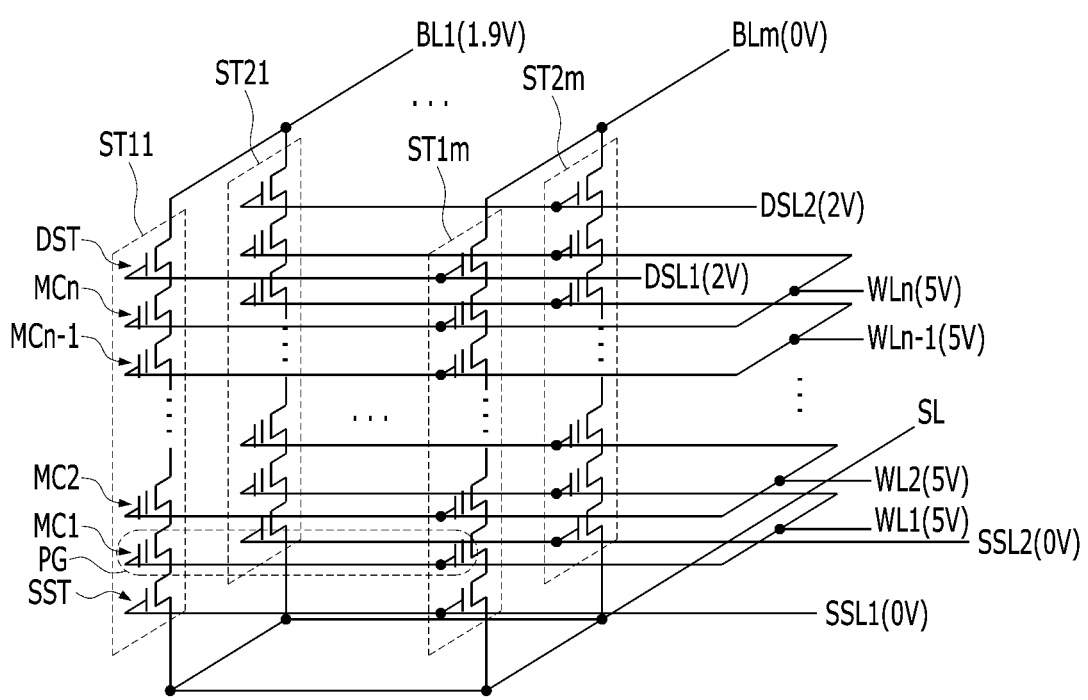

FIGS. 6 to 8 are diagrams for describing the de-trap operation performed in a unit of memory blocks of a semiconductor device in accordance with an embodiment of the present disclosure.

FIG. 6 may be a diagram in which the channel formation period A illustrated in FIG. 5 is applied to the memory block BK1.

Referring to FIG. 6, in the channel formation period A, the first bit line BL1 and the second bit line BLm may be driven at the first voltage level of 1.9 V, and the plurality of word lines WL1 to WLn may be driven at the second voltage level of 5 V. In this case, each of the first drain selection line DSL1 and the second drain selection line DSL2 may be driven at a voltage level of 2 V capable of turning on the drain selection transistor DST. In addition, the first source selection line SSL1 and the second source selection line SSL2 may be driven at the ground voltage, and thus the source selection transistor SST may be turned off. Accordingly, the channel CH having the predetermined voltage level of 5 V may be formed in the memory cells MC1 to MCn of the strings ST11, ST21, ST1m, and ST2m connected to the first and second bit lines BL1 and BLm driven at the first voltage level of 1.9 V and the word lines WL1 to WLn driven at the second voltage level of 5 V.

FIG. 7 may be a diagram in which the de-trap period B illustrated in FIG. 5 is applied to the memory block BK1. In this case, the memory cells on which the program operation is being performed may be cells indicated as the page PG. That is, the memory cells subject to the de-trap operation may be memory cells grouped as the page PG in FIG. 7.

Referring to FIG. 7, in the de-trap period B, the first and second bit lines BL1 and BLm may be driven at the ground voltage, and the first drain selection line DSL1 may be driven at the ground voltage, in order to de-trap only the memory cells grouped as the page PG on which the program operation is being performed, that is, the memory cells subject to the de-trap operation. In addition, only the first word line WL1 among the word lines WL1 to WLn may be driven at the ground voltage.

Since the first drain selection line DSL1 is driven at the ground voltage, and the drain selection transistor DST of the first string ST11 is turned off, the first string ST11 may be disconnected from the first bit line BL1. In addition, since the third string ST1m also includes a drain selection transistor connected to the first drain selection line DSL1, the third string ST1m may be disconnected from the second bit line BLm. Furthermore, since only the first word line WL1 among the word lines WL1 to WLn is driven at the ground voltage, the memory cells PG connected to the first word line WL1 among the memory cells connected to one another in series and included in the first and third strings ST11 and ST1m may be de-trapped.

The second drain selection line DSL2 having a voltage level maintained at the same voltage level of 2 V as the channel formation period A may maintain a turn-on state of drain selection transistors included in the second and fourth strings ST21 and ST2m. Therefore, since the second and fourth strings ST21 and ST2m and the first and second bit lines BL1 and BL2 driven at the ground voltage are connected to each other, channels of memory cells included in the second and fourth strings ST21 and ST2m, which have been formed in the channel formation period A may be removed. Accordingly, the memory cells included in the second and fourth strings ST21 and ST2m might not be de-trapped.

FIG. 8 is a diagram in which the channel formation period A illustrated in FIG. 5 is applied to the memory block BK1, and illustrates, as an example, a state in which the program operation has been completely performed on the memory cells of the third string ST1m connected to the second bit line BLm.

The first string ST11 and the second string ST21 including the memory cells on which the program operation has not been completely performed, that is, the program operation is being performed, may be connected to the first bit line BL1 driven at the first voltage level of 1.9 V. In addition, the third string ST1m and the fourth string ST2m including the memory cells on which the program operation has been completely performed may be connected to the second bit line BLm driven at the ground voltage. In this case, the word lines WL1 to WLn may be driven at the second voltage level of 5 V.

Therefore, the channels CH may be formed in only the memory cells of the first and second strings ST11 and ST21 connected to the first bit line BL1 driven at the first voltage level of 1.9 V.

Subsequently, as illustrated in FIG. 7, when the bit lines BL1 and BLm, the drain selection lines DSL1 and DSL2, and the word lines WL1 to WLn are driven as in the de-trap period B, only the memory cell MC1 connected to the first word line WL1 among the memory cells included in the first string ST11 in which the channels CH are formed, may be de-trapped.

As described above, during the de-trap operation, the semiconductor device might not form channels in memory cells on which the program operation has been completely performed, but may form channels in only memory cells on which the program operation has not been completely performed, and de-trap the memory cells.

Figure 9:
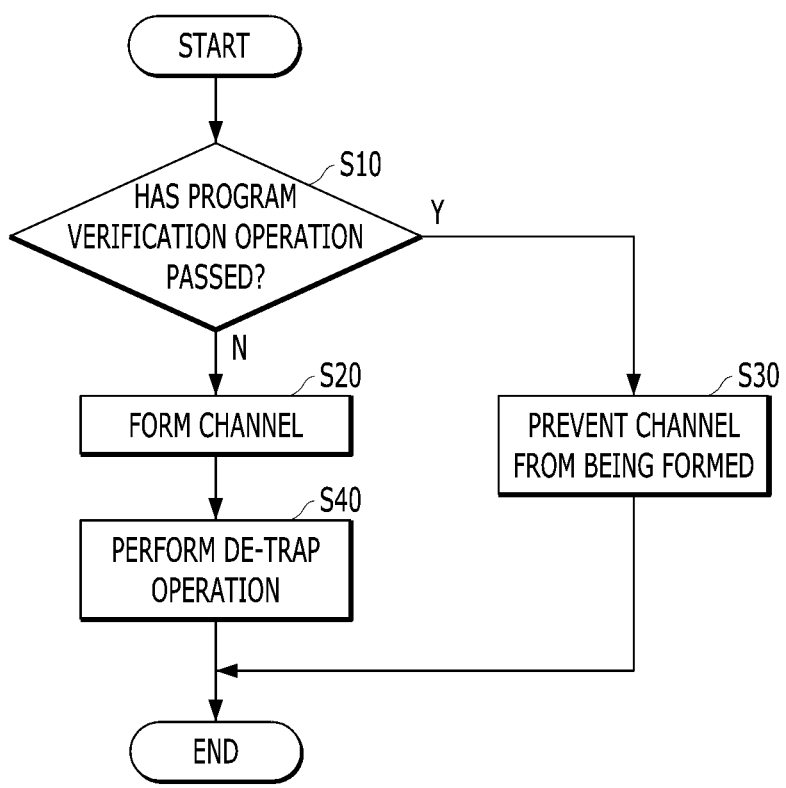
FIG. 9 is a flowchart for describing a de-trap operation of a semiconductor device in accordance with an embodiment of the present disclosure.

FIG. 9 is a flowchart for describing the de-trap operation of a semiconductor device in accordance with an embodiment of the present disclosure.

Referring to FIG. 9, an operating method of the semiconductor device performing the de-trap operation during the program operation may include checking a program verification result (operation S10), forming a channel (operation S20), preventing a channel formation (operation S30), and performing a de-trap operation (operation S40).

The operation S10 may include an operation of checking whether program verification operations are performed a predetermined number of times. In this case, the program verification operation, which is an operation of determining a memory cell whose threshold voltage exceeds a target level during the program operation, may include an operation of distinguishing a memory cell on which the program operation has been completely performed and a memory cell on which the program operation has not been completely performed.

When it is determined that the program operation has not been completely performed, that is, it is determined that the program verification operation has not passed ("N" in the operation S10), the operation S20 may be performed.

When it is determined that the program operation has been completely performed, that is, it is determined that the program verification operation has passed ("Y" in the operation S10), the operation S30 may be performed.

The operation S20 may include an operation of forming a channel having a predetermined voltage level in memory cells included in strings connected between a bit line and a word line by driving the bit line at a first voltage level and driving the word line at a second voltage level.

The operation S30 may include an operation of preventing the channel having the predetermined voltage level from being formed in the memory cells included in the strings connected between the bit line and the word line by driving the bit line at a ground voltage level even though the word line is driven at the second voltage level.

After performing the operation S20, the operation S40 may be performed.

The operation S40 may include an operation of driving the word lines at the ground voltage after disconnecting the strings including the memory cells in which the channels are formed from the bit lines and allowing the channels to float. In the de-trap operation, operation S40, since the word line is driven at the ground voltage lower than that of the channel formed at the predetermined voltage level, some of the charges trapped in the memory cells may be transferred to the channel.

Consequently, since the semiconductor device in accordance with an embodiment of the present disclosure performs the de-trap operation only on memory cells on which the program operation has not been completely performed during the program operation, threshold voltage distribution of the memory cells may be improved.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. A semiconductor device comprising:
   a plurality of strings connected between a plurality of bit lines and a source line;
   a plurality of page buffers connected to the plurality of bit lines, respectively, and configured to adjust a voltage level of each of the plurality of bit lines; and
   a control circuit configured to control, during a de-trap operation, the plurality of page buffers:
      to fix a voltage level of a bit line connected to a first string including a memory cell on which a program operation has been completely performed, and
      to change a voltage level of a bit line connected to a second string including a memory cell on which the program operation has not been completely performed.

2. The semiconductor device of claim 1, wherein the plurality of page buffers are connected to memory cells included in the plurality of strings through the plurality of bit lines, respectively, and are configured to sense threshold voltage levels of the memory cells, compare the sensed threshold voltage levels with a target level, and provide the control circuit with a comparison result as a program verification result.

3. The semiconductor device of claim 2, wherein the control circuit is configured to:
   distinguish the first string from the second string, based on the program verification result,
   fix the voltage level of the bit line connected to the first string to a ground voltage, and
   drive the voltage level of the bit line connected to the second string at a first voltage level higher than the ground voltage for a predetermined time.

4. The semiconductor device of claim 1, wherein each of the plurality of strings includes:
   a plurality of memory cells each having a gate connected to a plurality of word lines, respectively, and connected to one another in series;
   a drain selection transistor having a gate connected to a drain selection line, and connected between a bit line and one end of the plurality of memory cells; and
   a source selection transistor having a gate connected to a source selection line, and connected between the source line and another end of the plurality of memory cells.

5. The semiconductor device of claim 4, further comprising a line driving circuit configured to drive each of the plurality of word lines under control of the control circuit.

6. The semiconductor device of claim 5, wherein the line driving circuit drives the plurality of word lines at a second voltage level during the de-trap operation, and drives at least one word line selected from the plurality of word lines at a ground voltage after a predetermined time elapses.

7. The semiconductor device of claim 6, wherein the control circuit is configured to control the second string to be disconnected from the bit line and the source line while the selected at least one word line is driven at the ground voltage.

8. The semiconductor device of claim 7, wherein the control circuit is configured to control the drain selection transistor and the source selection transistor included in the second string to be turned off.

9. The semiconductor device of claim 8, wherein the control circuit is configured to control at least one of the drain selection transistor and the source selection transistor included in the first string to be turned on.

10. An operating method of a semiconductor device, the operating method comprising:
    performing a program verification operation;
    forming a channel in a memory cell based on the result of the program verification operation;
    performing a de-trap operation based on a result of the program verification operation; and
    providing a program pulse.

11. The operating method of claim 10, wherein the forming of the channel includes driving a voltage level of a bit line connected to the memory cell on which a program operation has not been completely performed at a voltage level higher than a ground voltage when the program verification operation is checked not to be passed.

12. The operating method of claim 11, further comprising fixing a voltage level of a bit line connected to a memory cell to a ground voltage when the program verification operation is checked to be passed.

13. An operating method of a semiconductor device, the operating method comprising:
    forming channels in memory cells connected to a plurality of bit lines and a word line selected among a plurality of word lines, wherein a program operation has not been completely performed on the memory cells;
    driving the selected word line and the plurality of bit lines at a ground voltage; and
    disconnecting a bit line connected to a memory cell subject to a de-trap operation among the memory cells.

14. The operating method of claim 13, wherein the forming of the channels includes:
    driving bit lines connected to first memory cells on which the program operation has not been completely performed among the plurality of bit lines at a first voltage level;
    driving bit lines connected to second memory cells on which the program operation has been completely performed among the plurality of bit lines at the ground voltage; and
    driving the selected word line at a second voltage level.

15. The operating method of claim 14, wherein the forming of the channels includes distinguishing the first memory cells from the second memory cells, based on a result of a program verification operation.

16. A semiconductor device comprising:
    memory cells subject to a program operation;
    a plurality of page buffers connected to the memory cells through a plurality of bit lines, respectively; and
    a control circuit configured to control the plurality of page buffers:
        to perform a de-trap operation on first memory cells on which the program operation has not been completely performed among the memory cells, and
        not to perform the de-trap operation on second memory cells on which the program operation has been completely performed among the memory cells.

17. The semiconductor device of claim 16, wherein the de-trap operation is an operation of forming channels each having a predetermined voltage level in the memory cells and driving a word line connected to the memory cells at a voltage level lower than voltage levels of the channels.

18. The semiconductor device of claim 17, wherein the control circuit is configured to control the plurality of page buffers:
    to form the channels in the first memory cells, and
    to prevent the channels from being formed in the second memory cells.

19. The semiconductor device of claim 18, wherein the control circuit is configured to control the plurality of page buffers:
    to drive bit lines connected to the first memory cells at a first voltage level, and
    to drive bit lines connected to the second memory cells at a ground voltage.

20. A semiconductor device comprising:
    a plurality of strings each including memory cells; and
    a control circuit configured to perform, on selected memory cells, a program operation in which program pulse application operations and program verification operations are alternately repeatedly performed,
    wherein the control circuit further performs, during a period between a program pulse application operation and a program verification operation, a de-trap operation on memory cells on which the program pulse application operations are performed a predetermined number of times and the program operation is not passed.

* * * * *